(12) United States Patent
Honkura et al.

(10) Patent No.: US 8,339,132 B2
(45) Date of Patent: Dec. 25, 2012

(54) MAGNETIC DETECTION DEVICE

(75) Inventors: Yoshinobu Honkura, Aichi (JP);
Michiharu Yamamoto, Aichi (JP);
Norihiko Hamada, Aichi (JP); Akihiro Shimode, Aichi (JP); Masayuki Kato, Aichi (JP)

(73) Assignee: Aichi Steel Corporation, Aichi (JP)

( * ) Notice: Subject to any disclaimer, the term of this patent is extended or adjusted under 35 U.S.C. 154(b) by 0 days.

(21) Appl. No.: 13/138,766

(22) PCT Filed: Mar. 26, 2010

(86) PCT No.: PCT/JP2010/055464
§ 371 (c)(1),
(2), (4) Date: Sep. 26, 2011

(87) PCT Pub. No.: WO2010/110456
PCT Pub. Date: Sep. 30, 2010

(65) Prior Publication Data
US 2012/0013332 A1    Jan. 19, 2012

(30) Foreign Application Priority Data

Mar. 26, 2009  (JP) ................................ 2009-077810

(51) Int. Cl.
*G01R 33/02* (2006.01)
(52) U.S. Cl. ................... 324/244; 324/252; 324/262
(58) Field of Classification Search ................ 324/244, 324/252, 262
See application file for complete search history.

(56) References Cited

U.S. PATENT DOCUMENTS 6,404,192 B1   6/2002   Chiesi et al.

FOREIGN PATENT DOCUMENTS

| JP | 2001-013231 A | 1/2001 |
|----|---|---|
| JP | 2001-027664 A | 1/2001 |
| JP | 2002-090432 A | 3/2002 |
| JP | 2005-159273 A | 6/2005 |
| JP | 2008-216181 A | 9/2008 |
| WO | WO-P2004/051298 A1 | 6/2004 |
| WO | WO-2005/008268 A1 | 1/2005 |

OTHER PUBLICATIONS

Office Action of Japanese Patent Application No. 2010-527263, 2 pgs., mailed on Aug. 17, 2010, (Japan).
International Search Report mailed onn Jun. 15, 2010, PCT/JP2010/055464.

*Primary Examiner* — Reena Aurora
(74) *Attorney, Agent, or Firm* — Rader, Fishman & Grauer PLLC

(57) ABSTRACT

A magnetic detection device of the present invention includes at least one pair of first magnetosensitive bodies each comprising a soft magnetic material extending in a first axis direction and being sensitive to an external magnetic field oriented in the first axis direction; and a magnetic field direction changer comprising a soft magnetic material and changing an external magnetic field oriented in a different axis direction from the first axis direction into a measurement magnetic field having a component in the first axis direction which can be detected by the at least one pair of first magnetosensitive bodies. With this magnetic detection device, the external magnetic field oriented in the different axis direction can be detected by way of the first magnetosensitive bodies. As a result, while attaining magnetic detection with high accuracy, the magnetic detection device can be reduced in size or thickness by omitting a magnetosensitive body extending long in the different axis direction.

9 Claims, 12 Drawing Sheets

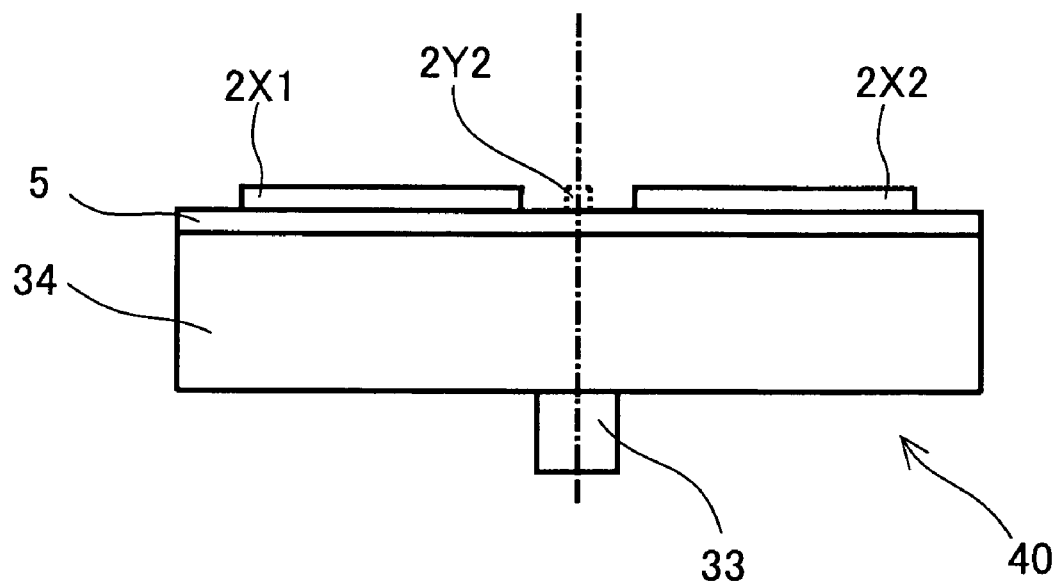
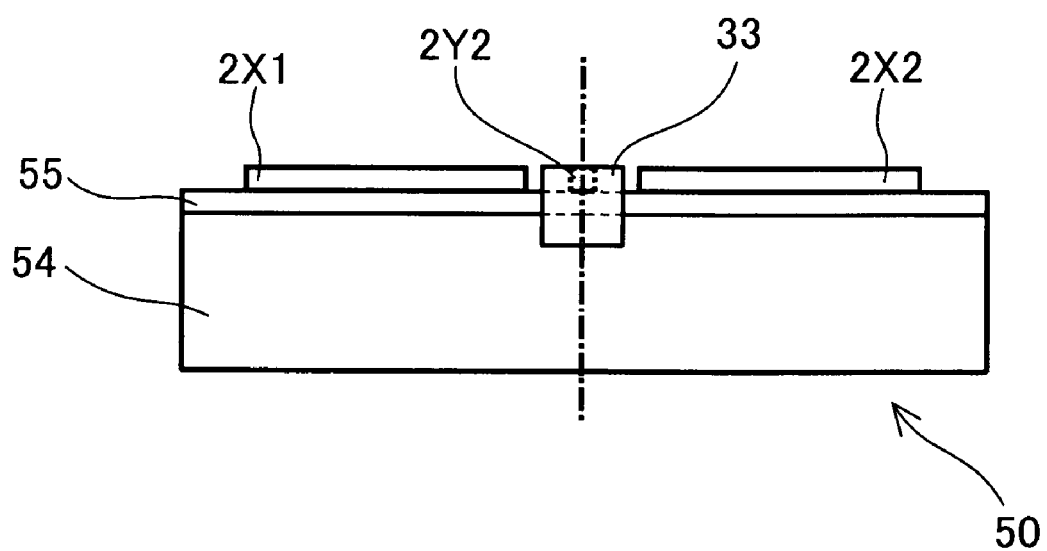

MAGNETIC DETECTION DEVICE

TECHNICAL FIELD

The present invention relates to a magnetic detection device used for a direction sensor or the like and detecting magnetism by MI elements.

BACKGROUND ART

Conventionally, magnetism has been measured to find a direction or the like. For example, an electronic compass measures a three-dimensional magnetic vector in order to find a precise direction. In this case, the electronic compass requires a magnetic sensor which individually measures magnetic vectors oriented in three directions of X, Y and Z.

A Hall element, an MR element or the like is employed as such a magnetic sensor. Nowadays, however, attention is focusing on a magneto-impedance element (appropriately abbreviated as an "MI element"), which is entirely different in structure and principle from such conventional elements and has an incomparably high sensitivity.

An MI element uses magneto-impedance effect (abbreviated as "MI effect"), which is a phenomenon in which when a high frequency pulse current or the like is applied to a magnetosensitive body such as an amorphous wire, its impedance changes with a magnetic field due to a skin effect. Magnetism such as an external magnetic field can be detected by measuring a change in its impedance or a change in magnetic flux generated in the magnetosensitive body and causing MI effect. It should be noted that a change in impedance is directly measured but a change in magnetic flux is measured by using a detection coil (a pickup coil) or the like wound around the magnetosensitive body. Such MI elements have already been used as MI sensors in electronic compasses or the like of a variety of devices.

CITATION LIST

Patent Literature

[PTL 1] WO2005/008268

SUMMARY OF INVENTION

Problems to be Solved by the Invention (1) By the way, when a three-dimensional magnetic vector is to be obtained by using MI elements, conventionally an individual MI element has been used for each direction of the magnetic vector to be detected. For example, as shown in FIG. 15, PTL1 (WO2005/008268) discloses the use of three MI elements 101, 102, 103 placed on a substrate 1000 in order to obtain a three-dimensional magnetic vector. Specifically, the X-axial MI element 101 and the Y-axial MI element 102 are placed on a substrate flat surface (in an X-Y plane) so as to be orthogonal to each other, and the Z-axial MI element 103 is placed so as to be perpendicular to the substrate flat surface.

Generally, an MI element comprises an amorphous wire, a thin film or the like, which is a magnetosensitive body extending for a certain length in one axis direction. This magnetosensitive body detects a magnetic field component in the direction of the extending axis but cannot detect magnetic field components in directions perpendicular to the magnetosensitive body. Therefore, in order to detect a magnetic field oriented in a Z-axis direction, i.e., a perpendicular direction to the substrate, it has been necessary to provide a magnetosensitive body which extends long in the Z-axis direction. In other words, a Z-axial MI element extending perpendicularly to the substrate has been necessary. Therefore, approximate height of a conventional three-dimensional magnetic field detection device using MI elements has been determined by length of a Z-axial MI element. In this case, if the length of the magnetosensitive body is decreased too much in order to reduce height in the Z-axis direction, its capability of detecting magnetism is decreased and highly-sensitive magnetic detection becomes difficult. For these reasons, a three-dimensional magnetic detection device using MI elements has been considered difficult to be reduced in size in the Z-axis direction or thickness.

(2) Moreover, in such a conventional three-dimensional magnetic detection device as shown in FIG. 15, three MI elements, i.e., the X-axial MI element 101, the Y-axial MI element 102 and the Z-axial MI element 103 are arranged at sides of the substrate 1000 on a surface of which an integrated circuit 200 including electronic circuits for driving these elements is formed. Therefore, such a conventional magnetic detection device tends to be big also in a planar direction in parallel to the substrate (an X-Y plane), and it has been considered difficult to be reduced in size in that direction.

Furthermore, these MI elements 101, 102, 103 and the integrated circuit 200 have been connected with each other by what is called wire bonding. Therefore, additional space for wire bonding has been required and such a conventional magnetic detection device has been difficult to be reduced in size. Especially in respect to the Z-axis direction, the Z-axial MI element 103 is originally long and additionally wire bonded in the Z-axis direction. Therefore, such a magnetic detection device has been very difficult to be reduced in size in the Z-axis direction or thickness. Besides, since wire bonding needs to install wires one by one, a wire bonding step requires much longer time. Therefore, there is a limit in improving productivity of magnetic detection devices using MI elements of a conventional structure.

The present invention has been made in view of these circumstances. It is an object of the present invention to provide a magnetic detection device which can be remarkably reduced in size or thickness in comparison with conventional ones, while employing MI elements. It is an object of the present invention to provide a three-dimensional magnetic field detection device which can be reduced in overall size, for example, by suppressing height in a perpendicular direction to a substrate (in a Z-axis direction) and additionally suppressing size in a parallel direction to the substrate (an X-Y direction), when stored in a thin housing such as those of mobile terminals.

Means for Solving the Problems

The present inventors have earnestly studied and made trials and errors to solve these problems. As a result, the present inventors have thought up of an idea that upon providing a soft magnetic body separately from MI elements, magnetism oriented in a certain direction can be detected without providing an MI element for exclusively detecting magnetism oriented in the certain direction. The present inventors have newly found that upon providing a soft magnetic body in an appropriate arrangement without providing an MI element for detecting magnetism oriented in a Z-axis direction (a Z-axial MI element), for instance, magnetism oriented in the Z-axis direction can be detected by using MI elements for detecting magnetism oriented in an X-axis direction (X-axial MI elements) and/or MI elements for detecting magnetism oriented in a Y-axis direction (Y-axial MI elements). The present inventors have done further research on this finding and completed the following aspects of the present invention.

<Magnetic Detection Device>

(1) That is to say, a magnetic detection device of the present invention characteristically includes: at least one pair of first magnetosensitive bodies each comprising a soft magnetic material extending in a first axis direction and being sensitive to an external magnetic field oriented in the first axis direction; a magnetic field direction changer comprising a soft magnetic material and changing an external magnetic field oriented in a different axis direction from the first axis direction into a measurement magnetic field having a component in the first axis direction which can be detected by the at least one pair of first magnetosensitive bodies, thereby being capable of detecting the external magnetic field oriented in the different axis direction by way of the first magnetosensitive bodies.

(2) According to the present invention, the magnetic field direction changer changes an external magnetic field oriented in a different axis direction which originally cannot be sensed by the first magnetosensitive bodies into a measurement magnetic field having a component which can be sensed by the first magnetosensitive bodies. Owing to the presence of at least one pair of first magnetosensitive bodies, if the first magnetosensitive bodies and a soft magnetic body are arranged appropriately, an external magnetic field originally present in a first axis direction and a measurement magnetic field oriented in the first axis direction changed from an external magnetic field oriented in a different axis direction can be detected in a manner to be distinguished from each other. In this way, magnetosensitive bodies extending in one axis direction can detect an external magnetic field oriented in a different axis direction from the one axis direction. As a result, desired magnetic detection is achieved by a magnetic detection device in which arrangement of magnetosensitive bodies or MI elements is scaled down from two-dimensional arrangement to one-dimensional arrangement or from three-dimensional arrangement to two-dimensional arrangement. Thus the magnetic detection device of the present invention can be remarkably reduced in size or thickness.

(3) When a magnetic detection device is considered to be three dimensional, it is preferable that in addition to the above constitution, the magnetic detection device of the present invention further includes at least one pair of second magnetosensitive bodies each comprising a soft magnetic material extending in a second axis direction and being sensitive to an external magnetic field oriented in the second axis direction, and the magnetic field direction changer changes an external magnetic field oriented in a different axis direction from the first axis direction and the second axis direction into a measurement magnetic field having a component in the first axis direction and/or a component in the second axis direction which can be detected by the at least one pair of first magnetosensitive bodies and/or the at least one pair of second magnetosensitive bodies.

<Three-Dimensional Magnetic Detection Device>

(1) Furthermore, the present invention can be a concrete three-dimensional magnetic detection device such as follows. That is to say, the present invention includes a substrate, a soft magnetic body (a magnetic field direction changer) arranged on the substrate, two X-axial MI elements for mainly detecting a magnetic field component in an X-axis direction (a first axis direction) (elements including first magnetosensitive bodies), and two Y-axial MI elements for mainly detecting a magnetic field component in a Y-axis direction (a second axis direction) (elements including second magnetosensitive bodies). The two X-axial MI elements are placed on both sides of the soft magnetic body on the substrate so as to lie along the same straight line (a first straight line; a first axis) with the soft magnetic body in the center. The two Y-axial MI elements are placed on both sides of the soft magnetic body on the substrate so as to lie along the same straight line (a second straight line; a second axis) with the soft magnetic body in the center. The first straight line and the second straight line intersect each other at a predetermined degree angle. Suppose VX1 is a detected voltage from a first X-axial MI sensor comprising a first X-axial MI element, a pulse oscillation circuit and a signal processing circuit, VX2 is a detected voltage from a second X-axial MI sensor comprising a second X-axial MI element, a pulse oscillation circuit and a signal processing circuit, VY1 is a detected voltage from a first Y-axial MI sensor comprising a first Y-axial MI element, a pulse oscillation circuit and a signal processing circuit, and VY2 is a detected voltage from a second Y-axial MI sensor comprising a second Y-axial MI element, a pulse oscillation circuit and a signal processing circuit. Then, the three-dimensional magnetic detection device of the present invention characteristically includes a calculation unit for respectively calculating an output voltage DX corresponding to an X-axis direction component of an external magnetic field, an output voltage DY corresponding to a Y-axis direction component of the external magnetic field, and an output voltage DZ corresponding to a Z-axis direction component of the external magnetic field by using the following arithmetic expressions ([Math. 1]).

With this constitution, a three-dimensional magnetic vector in an X-axis direction, a Y-axis direction, and a Z-axis direction (a different axis direction) can be detected without using a Z-axial MI element extending along a Z axis perpendicular to the substrate, and being essential for a conventional three-dimensional magnetic detection device. As a result, height in the direction perpendicular to the substrate (the Z-axis direction) can be suppressed and a compact three-dimensional magnetic field detection device can be provided. It should be noted that an X-axis direction mentioned here means any one axis direction in parallel to a substrate and a Y-axis direction is a direction which is in parallel to the substrate and intersects the X-axis direction at a predetermined degree angle.

(2) Preferably the abovementioned three-dimensional magnetic detection device further includes, for example, the following constitution. That is to say, the substrate comprises a silicon substrate on which an integrated circuit (a drive circuit) including the pulse oscillation circuits and the signal processing circuits of the respective MI sensors and the calculation unit is formed. This silicon substrate has an electrically insulating coating layer on an upper surface thereof. The electrically insulating coating has terminal holes for connecting respective terminals of the MI elements and respective terminals of the integrated circuit on the silicon substrate. With this constitution, MI elements, which have conventionally been placed on sides of an integrated circuit, can be placed on the integrated circuit. Thus provided is a three-dimensional magnetic field detection device which is also reduced in size in a parallel direction to a substrate (an X-axis direction and a Y-axis direction).

<Others>

(1) An "MI element" mentioned in this description of the present invention includes not only a magnetosensitive body such as an amorphous wire and a thin film but also detection means for detecting magnetism sensed by the magnetosensitive body. The detection means is, for example, a detection coil such as a pickup coil provided around a magnetosensitive body. Such a detection coil can be formed by winding a wire or by pattern wiring. Needless to say, the detection means can be means for directly measuring impedance or its variation of a magnetosensitive body.

(2) "Direction change" mentioned in this description of the present invention means to change the direction of a magnetic field or a magnetic field component which is not sensed by a magnetosensitive body to a direction which can be sensed by the magnetosensitive body. Upon this direction change, a magnetic field which is originally not sensed by a magnetosensitive body becomes a magnetic field having at least a direction component to be sensed by the magnetosensitive body, and as a result, such a magnetic field can be detected by an MI element comprising the magnetosensitive body.

(3) An "external magnetic field" of this description of the present invention is a magnetic field which acts from an outside on a magnetic detection device (an environmental magnetic field) and is to be detected by a magnetic detection device. A "measurement magnetic field" is an external magnetic field to be sensed by a magnetosensitive body and detected or measured by an MI element.

BRIEF DESCRIPTION OF DRAWINGS

FIG. 10 is a cross sectional view of a three-dimensional magnetic detection device according to Embodiment 4.

FIG. 11 is a cross sectional view of a three-dimensional magnetic detection device according to Embodiment 5.

Figure 1A:
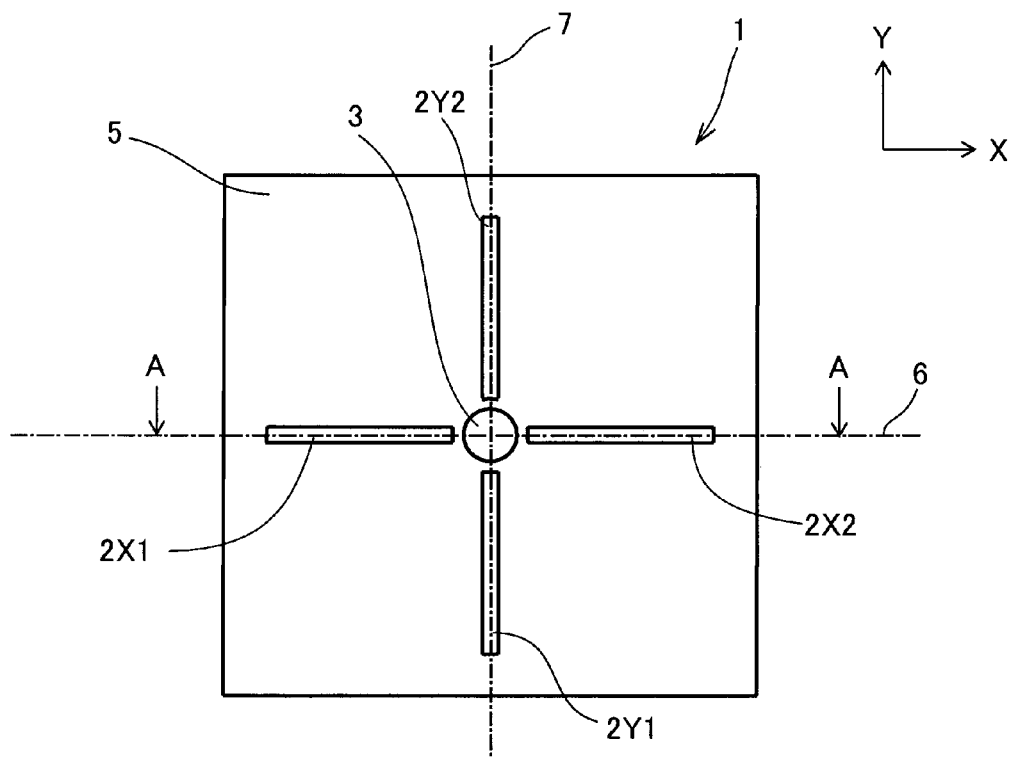
FIG. 1A is a plan view of a three-dimensional magnetic field detection device according to Embodiment 1.

| REFERENCE SIGNS LIST | | | |
|---|---|---|---|
| 1: | a three-dimensional magnetic detection device | | |
| 2: | MI elements | | |
| 2X: | X-axial MI elements | 2Y: | Y-axial MI elements |
| 21: | a magnetosensitive wire | 22: | a detection coil |
| 23: | an electrical insulator | | |
| 251: | terminals for a magnetosensitive wire | | |
| 252: | terminals for a detection coil | | |
| 3: | a soft magnetic body | 4: | a silicon substrate |
| 5: | an electrically insulating coating layer | | |
| 6: | a first straight line | 7: | a second straight line |
| 8: | an MI sensor | 81: | a pulse oscillation circuit |
| 82: | a signal processing circuit | | |
| 9: | a calculation unit | 10: | a pulse current waveform |

MODES FOR CARRYING OUT THE INVENTION

The present invention will be described in more detail by way of modes for carrying out the invention. The above-mentioned constitution of the present invention can be added with one or more constituents arbitrarily selected from those of the description of the present invention. Which mode is best depends on application target, required performance and so on.

<MI Element>

The magnetic detection device of the present invention is a device for detecting magnetism by employing magneto-impedance elements (MI elements). As mentioned before, each MI element includes a magnetosensitive body which senses magnetism such as a magnetic field and generates a change in impedance or a change in magnetic flux, and detecting means for detecting the amount of change of the magnetosensitive body. The material or shape of the magnetosensitive body is not limited. Generally, the magnetosensitive body comprises a soft magnetic material and has the shape of a wire having an appropriate length or a thin film. It is particularly preferable in view of sensitivity, costs and so on that the magnetosensitive body is a zero magnetostrictive amorphous wire.

The kind or shape of the detecting means is appropriately selected in accordance with the kind and shape of magnetosensitive bodies, the kind of changed amount of the magnetosensitive bodies to be detected, specifications, and so on. The detecting means can be, for example, means for directly detecting impedance of a magnetosensitive body or voltage at both ends of a magnetosensitive body, or a pickup coil (a detection coil) which is wound around an extending magnetosensitive body and outputs an electromotive force corresponding to a change in magnetic flux.

The magnetosensitive body can be provided in a manner to have a space from a magnetosensitive body mounting surface, to be contacted with the mounting surface, or to be embedded in a groove or the like. The detection coil can be wound around an outer peripheral surface of a holder (an electrical insulator, a substrate, a housing, or the like) of a magnetosensitive body or around an inner peripheral surface of a groove or the like.

<Magnetic Field Direction Changer>

A magnetic field direction changer serves to change the direction of a magnetic field oriented in a different axis direction along which no magnetosensitive body is arranged, thereby enabling magnetic detection by a magnetosensitive body or an MI element arranged in an axis direction other than the different axis direction. As long as magnetic detection by a magnetosensitive body is possible as just described, the material or shape of the magnetic field direction changer is not limited. It is preferable that the magnetic field direction changer comprises a soft magnetic material, and as the soft magnetic material has a higher magnetic permeability, it is more preferable because the magnetic field direction changer has a greater magnetic attraction effect. Besides, it is preferable that the magnetic field direction changer has a shape which facilitates changing the direction of a magnetic field toward magnetosensitive bodies. It is also preferable that the magnetic field direction changer is arranged in a relative position which allows a direction-changed magnetic field to be easily sensed by magnetosensitive bodies. For example, it is preferable that an end portion of a magnetic field direction changer (a corner portion of an end surface of a column-like body) which converges or radiates a magnetic field has a shape which is oriented to magnetosensitive bodies. It is more preferable that such an end portion of a magnetic field direction changer and magnetosensitive bodies are arranged in proximity. Conversely, it is not preferable to provide magnetosensitive bodies in an axial direction in a manner to cross a vicinity of a center of an extending axis of the magnetic field direction changer, at which the direction of a magnetic field is hardly changed by the magnetic field direction changer.

<Arrangement>

Unless it deviates from the gist of the present invention, arrangement of magnetosensitive bodies or a magnetic field direction changer is not limited. However, in order to detect magnetism oriented in a different axis direction with at least one pair of magnetosensitive bodies arranged in one axis direction, it is more or less necessary to make calculation based on amounts detected by MI elements including these magnetosensitive bodies. A simpler calculation is more preferable in order to make magnetic detection with a high accuracy at low costs. For example, it is preferable that different axis direction components of an external magnetic field are respectively calculated based on values obtained by adding or subtracting amounts detected by one pair of MI elements which correspond to one pair of magnetosensitive bodies.

Therefore, it is preferable that, for example, a pair of MI elements having the same detection characteristics are arranged in symmetry with respect to a certain point (a specific point). With this arrangement, the respective MI elements can equally detect an external magnetic field oriented in a direction of an extending axis of the respective magnetosensitive bodies constituting the respective MI elements (a first axis direction). In this arrangement, it is more preferable that a magnetic field direction changer is arranged in a manner that one of the pair of MI elements can detect an external magnetic field oriented in a different axis direction and having been changed by the magnetic field direction changer, as an opposite direction component in the first axis direction.

For example, it is preferable that a magnetic field direction changer is symmetrical with respect to the above-mentioned certain point. Specifically speaking, when the number of magnetic field direction changers is one, preferably the magnetic field direction changer is arranged at the certain point. When the number of magnetic field direction changers is two or more, preferably the magnetic field direction changers, including their shape, are symmetrical with respect to the certain point. For example, it is preferable that the magnetic field direction changer is arranged along a straight line which passes through a middle point between a pair of magnetosensitive bodies provided along one axis (a certain point) at an equal distance from the certain point (i.e., equally). When a pair of equivalent magnetosensitive bodies are arranged in parallel to each other, a magnetic field direction changer can be provided at a point which makes the magnetosensitive bodies symmetrical (a certain point) or magnetic field direction changers can be arranged equally with respect to the certain point along a straight line which passes through the certain point.

Needless to say, these arrangements are based on a premise that members in each group of magnetosensitive bodies, MI elements and magnetic field direction changers arranged in symmetry are respectively substantially the same in sensing characteristics, detection characteristics, magnetic attraction characteristics and so on. Specifically, magnetosensitive bodies are preferably the same in material and shape (wire diameter and wire length, film thickness and film width, or the like). MI elements are preferably the same in having magnetosensitive bodies of the same characteristics, in the constitution of circuits for measuring impedance, in the shape of coils for detecting magnetic flux (number of turns, radius of coil, etc.), or the like. Magnetic field direction changers are preferably the same in material and in shape viewed from respective magnetosensitive bodies.

These situations are summarized in a phrase "a pair of magnetosensitive bodies are symmetrical with respect to a certain point" or "a magnetic field direction changer is symmetrical with respect to a certain point" in this description of the present invention. "Point symmetry" mentioned in this description of the present invention can be one-dimensional point symmetry (point symmetry in a straight line), two-dimensional point symmetry (point symmetry in a plane), or three-dimensional point symmetry (point symmetry in a three-dimensional space).

Examples of one-dimensional point symmetry include a case in which a magnetic field direction changer is arranged at a certain point (generally a middle point between the two magnetosensitive bodies) with respect to which a pair of equivalent magnetosensitive bodies provided along one axis are symmetrical, and a case in which magnetic field direction changers are arranged at positions at equal distances from the certain point (at equal positions) on each side of the certain point. Examples of two-dimensional point symmetry include a case in which on a flat plane (on an upper surface or a lower surface) in which a pair of equivalent magnetosensitive bodies are arranged in symmetry, equivalent magnetic field direction changers are arranged equally in the shape of dots, lines, or rings with respect to a certain point, which is a symmetry point of the pair of magnetosensitive bodies. Examples of three-dimensional point symmetry include a case in which on each side of a plane in which a pair of equivalent magnetosensitive bodies are arranged in symmetry, equivalent magnetic field direction changers are arranged equally in the shape of dots, lines, planes, or rings with respect to a certain point, which is a symmetrical point of the pair of magnetosensitive bodies.

In any case, it is preferable to simplify a correction coefficient, a correction term and so on in arithmetic expressions by taking advantage of symmetry of a pair of MI elements or a pair of magnetosensitive bodies and a magnetic field direction changer, because magnetic detection with a high accuracy becomes easy.

<Laminated Layers>

The present invention is characterized in that upon providing a magnetic field direction changer, a magnetosensitive body or an MI element for exclusively detecting a magnetic field oriented in a different axis direction can be omitted and a magnetic detection device can be reduced in size or thickness. Therefore, real arrangement of magnetosensitive bodies or MI elements with respect to other electronic circuits such as their drive circuits is not necessarily an essential feature. However, in order to promote a reduction in overall size or thickness of a magnetic detection device, it is preferable that a magnetosensitive layer in which magnetosensitive bodies are arranged and a circuit layer in which their drive circuits are arranged are laminated. With this arrangement, electrical connection between the magnetosensitive bodies and their drive circuits can be made through laminated layers of the magnetosensitive layer and the circuit layer, and conventional wire bonding which requires additional space can be avoided. Therefore, a magnetic detection device can be further reduced in size or thickness. It should be noted that the magnetosensitive layer and the circuit layer do not have to be laminated next to each other and that an intermediate layer may be present between these two layers.

Moreover, laminated layers or an integrated layer are not limited to the magnetosensitive layer and the circuit layer. At least one detection layer in which a detection element other than a pair of magnetosensitive bodies is provided can be laminated with the magnetosensitive layer and the circuit layer. In this case, too, the lamination relationship is not limited, and these respective layers do not have to be laminated next to each other. Moreover, a layer of a detection circuit for driving the detection element can be further laminated. In this case, if electrical connection between the detection layer and the detection circuit layer is made through these laminated layers, an overall sensor device can be reduced in size or thickness. With this kind of lamination, the magnetic detection device of the present invention can develop from a mere magnetic sensor to a build-up sensor in which an acceleration sensor, a temperature sensor or the like are laminated.

EMBODIMENTS

The present invention will be explained in detail based on the following embodiments with reference to the drawings.

Embodiment 1

Figure 1B:
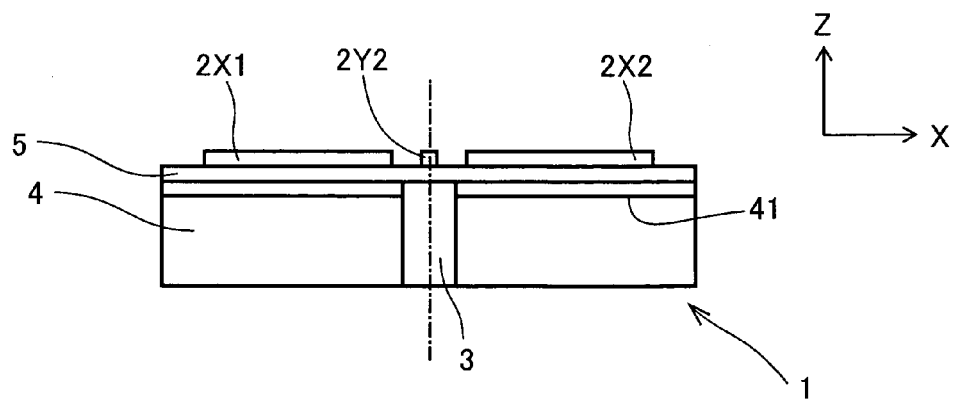
FIG. 1B is a cross sectional view cut along the line A-A in the plan view of FIG. 1A.

A three-dimensional magnetic detection device 1 according to Embodiment 1 is shown in FIG. 1. FIG. 1A is a plan view of the three-dimensional magnetic detection device 1 and FIG. 1B is a cross sectional view cut along the line A-A in FIG. 1A.

<Three-Dimensional Magnetic Detection Device>

(1) The three-dimensional magnetic detection device 1 comprises four MI elements 2 for detecting geomagnetism (an external magnetic field), a rod-shaped soft magnetic body (a magnetic field direction changer) 3, a silicon substrate 4 having an integrated circuit 41 (including drive circuits) thereon, and an electrically insulating coating layer 5, and terminal holes (not shown) for respectively connecting terminals of the MI elements 2 and terminals of the integrated circuit 41. The four MI elements 2 comprise two X-axial MI elements 2X1, 2X2 (arbitrarily collectively referred to as "X-axial MI elements 2X"), and two Y-axial MI elements 2Y1, 2Y2 (arbitrarily collectively referred to as "Y-axial MI elements 2Y").

A center of the silicon substrate 4 has a cylindrical hole whose axis is a Z axis. The cylindrical soft magnetic body 3 is inserted in this hole perpendicularly to the substrate 4. The soft magnetic body 3 is formed of a permalloy having a composition of 45 at % Ni—Fe. In addition to such a permalloy, the soft magnetic body 3 can be formed of other known soft magnetic materials such as pure Ni, pure iron, permalloys of other compositions, sendust alloys and permendur.

The integrated circuit 41 comprising electronic circuits including drive circuits, not shown, for the respective MI elements 2, and a calculation unit 9 (see FIG. 6) mentioned later has been formed on the silicon substrate 4. Each of these drive circuits comprises a pulse oscillation circuit 81 and a single processing circuit 82 (see FIG. 6). These circuits have been formed by a known method for producing an integrated circuit.

The electrically insulating coating layer 5 has been formed above the silicon substrate 4 so as to protect the silicon substrate 4 and at the same time ensure electrical insulation between the integrated circuit 41 and the MI elements 2. The electrically insulating coating layer 5 has been formed by coating an upper surface of the silicon substrate 4 with an organic resin or an inorganic material such as $SiO_2$.

As shown in FIG. 1A, the two X-axial MI elements 2x and the two Y-axial MI elements 2Y are placed on this electrically insulating coating layer 5. That is to say, the two X-axial MI elements 2x extend on both sides of the soft magnetic body 3 so as to be symmetrical with respect to the soft magnetic body 3 and lie along the same straight line (a first straight line 6, a first axis). Similarly, the two Y-axial MI elements 2Y extend on both sides of the soft magnetic body 3 so as to be symmetrical with respect to the soft magnetic body 3 and lie along the same straight line (a second straight line 7, a second axis).

(2) The first straight line 6 (the X axis) along which the X-axial MI elements 2x extend and the second straight line 7 (the Y axis) along which the Y-axial MI elements 2Y extend intersect each other at a 90 degree angle (i.e., orthogonally cross each other). These lines 6, 7 do not always have to intersect each other at right angles but if these lines 6, 7 intersect each other at right angles, post-processing (correction processing), etc. can be simplified. In this embodiment, the two X-axial MI elements 2X and the two Y-axial MI elements 2Y are respectively arranged at an equal distance from a center of the soft magnetic body 3. In this case, too, these elements 2X, 2Y do not always have to be arranged at an equal distance, but if these elements 2X, 2Y are arranged at an equal distance, processing can be simplified and magnetic detection can be made with a high accuracy.

<MI Elements>

Figure 2:
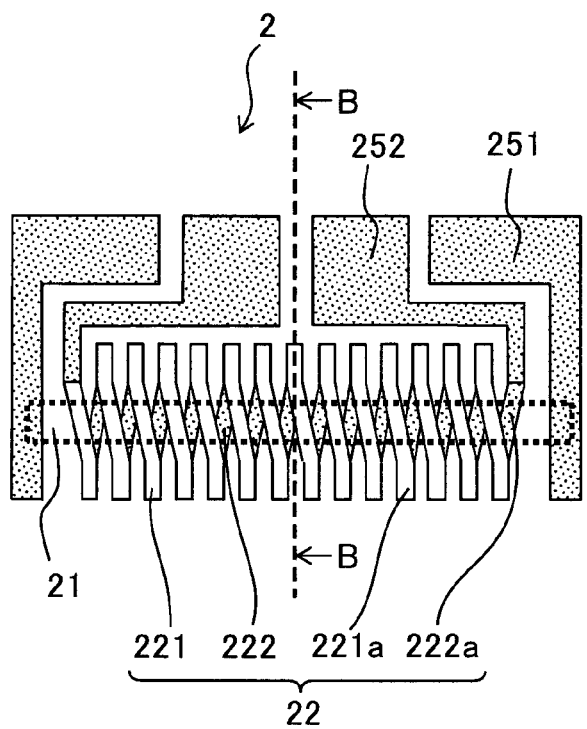
FIG. 2 is a schematic plan view showing an MI element according to Embodiment 1.

(1) Structure of the MI elements 2 constituting the X-axial MI elements 2X1, 2X2 and the Y-axial MI elements 2Y1, 2Y2 will be described in detail with reference to FIG. 2 and FIG. 3.

The MI elements 2 are placed on the electrically insulating coating layer 5 which covers the integrated circuit 41 (see FIG. 1B) formed on a surface of the silicon substrate 4 comprising a nonmagnetic material. Each of the MI elements 2 includes a planar pattern 222 comprising a plurality of first electrically conductive films 222a arrayed on a flat surface of the electrically insulating coating layer 5; a magnetosensitive wire 21 (a magnetosensitive body) comprising an amorphous wire having a circular cross section and provided along an array direction of the planar pattern 222 so as to cross the plurality of first electrically conductive films 222a; an electrical insulator 23 which covers an outer peripheral surface of the magnetosensitive wire 21 and at the same time fixes the magnetosensitive wire 21 on the planar pattern 222; and a three-dimensional pattern 221 comprising a plurality of second electrically conductive films 221a formed so as to extend continuously on an outer surface of the electrical insulator 23 and on a surface of the planar pattern 222 and at the same time cross over the magnetosensitive wire 21.

The planar pattern 222 and the three-dimensional pattern 221 are joined together on each side of the magnetosensitive wire 21 so as to laminate end portions of the first electrically conductive films 222a and those of the second electrically conductive films 221a, thereby forming lamination joints. Upon this integration of the planar pattern 222 and the three-dimensional pattern 221, a detection coil 22, which surrounds the magnetosensitive wire 21 and the electrical insulator 23, is formed on a flat surface of the electrically insulating coating layer 5.

Figure 3:
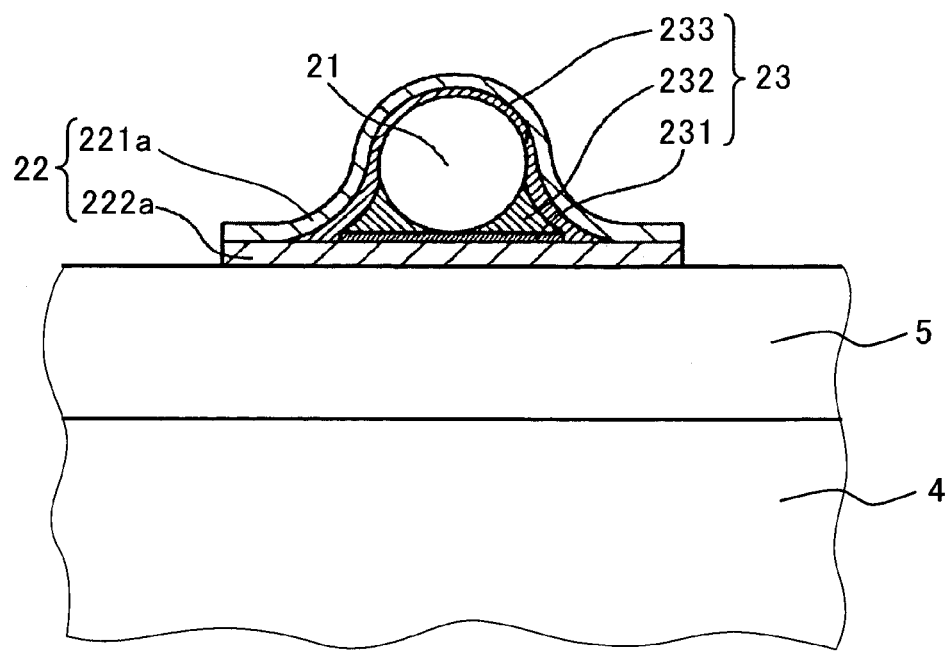
FIG. 3 is a cross sectional view taken in the direction of the arrows along the line B-B in the plan view of FIG. 2.

As shown in FIG. 3, the electrical insulator 23 widens toward the planar pattern 222 in a cross section perpendicular to an axis of the magnetosensitive wire 21. That is to say, width of the electrical insulator 23 in a parallel direction to the planar pattern 222 is larger toward the planar pattern 222. Specifically speaking, the electrical insulator 23 comprises three parts, i.e., a planar electrically insulating portion 231 which covers a surface of the planar pattern 222 to electrically insulate the magnetosensitive wire 21 from the planar pattern 222; a wire fixing portion 232 located between the planar electrically insulating portion 231 and the magnetosensitive wire 21 to fix the magnetosensitive wire 21 on the electrically insulating coating layer 5 by way of the planar pattern 222; and a three-dimensional electrically insulating portion 233 located between the magnetosensitive wire 21 and the three-dimensional pattern 221 to electrically insulate one from the other.

At least the wire fixing portion 232 is formed by solidifying a liquid resin. The planar electrically insulating portion 231 has a film shape and is formed separately from the wire fixing portion 232 before its formation. The three-dimensional insulating portion 233 also has a film shape and is formed separately from the wire fixing portion 232.

The magnetosensitive wire 21 comprises an amorphous wire having zero magnetostriction. Both ends of the magnetosensitive wire 21 are connected to electrodes 251 for applying a pulse current. The detection coil 22 is connected to electrodes 252 for detecting voltage which varies with an external magnetic field. Terminal arrangement shown in FIG. 2 as an example corresponds to the integrated circuit 41 on the silicon substrate 4. Respective terminals of the respective MI elements 2 and the respective terminals of the integrated circuit 41 on the silicon substrate 4 are electrically connected to each other through terminal holes, not shown, provided on the electrically insulating coating layer 5. In this embodiment, the magnetosensitive wire 21 has a diameter of 20 μn and a length of 0.6 mm and the detection coil 22 has 15 turns.

(2) These MI elements 2 are placed directly on the electrically insulating coating layer 5. Therefore, the MI elements 2 greatly reduce a height of a magnetic detection device in a Z-axis direction and contribute to miniaturization in the Z-axial direction in comparison with MI elements of a known groove-type structure (see PTL 1) in which amorphous magnetosensitive wires are stored in grooves of a substrate.

<Drive Circuit>

Figure 4:
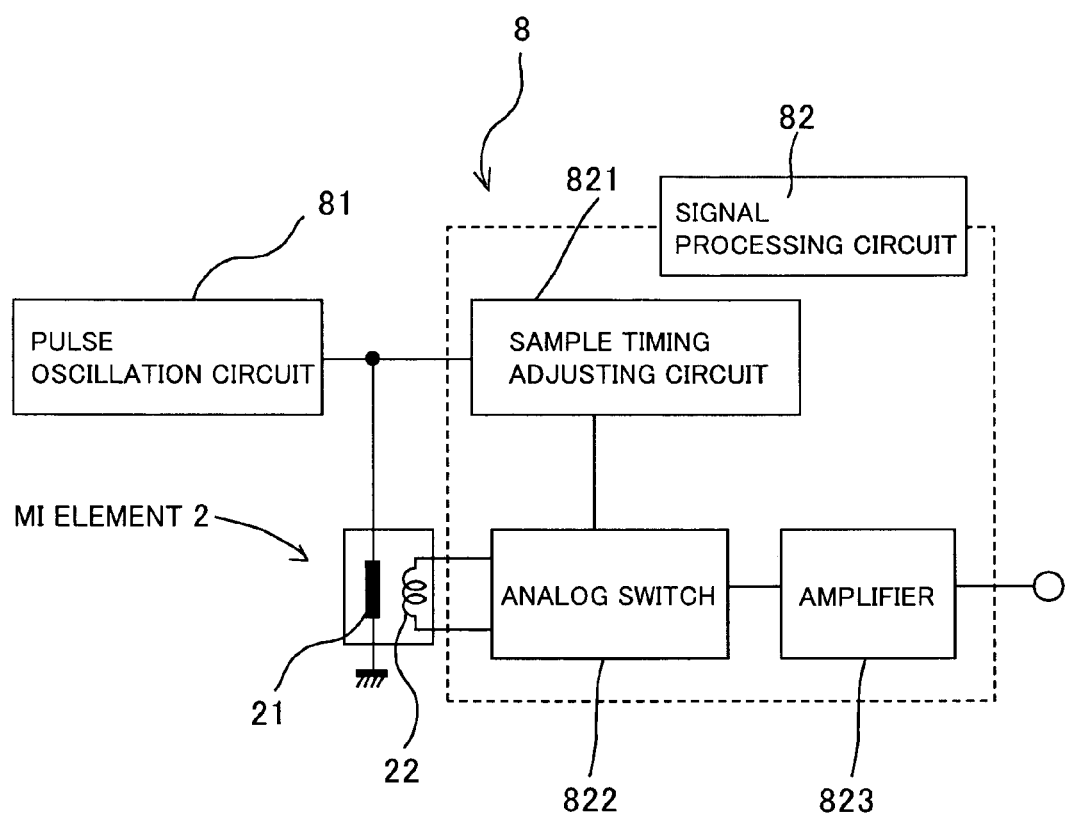
FIG. 4 is an electrical circuit diagram of an MI sensor using an MI element according to Embodiment 1.

(1) An MI sensor circuit 8 (a drive circuit) using one of the abovementioned MI elements 2 is shown in FIG. 4. The MI sensor circuit 8 includes a pulse oscillation circuit 81 and a signal processing circuit 82 both incorporated in the integrated circuit 41. The signal processing circuit 82 comprises a sample timing adjusting circuit 821, an analog switch 822 and an amplifier 823. This MI sensor circuit 8 operates as follows.

Figure 5A:
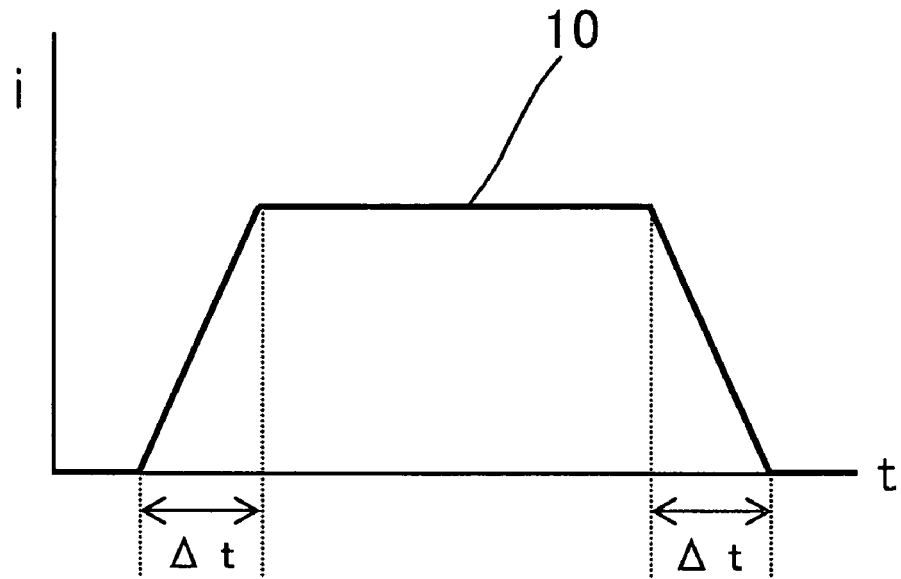
FIG. 5A is a waveform diagram showing a pulse current waveform to be applied to the MI element and the MI sensor of FIG. 4.
Figure 5B:
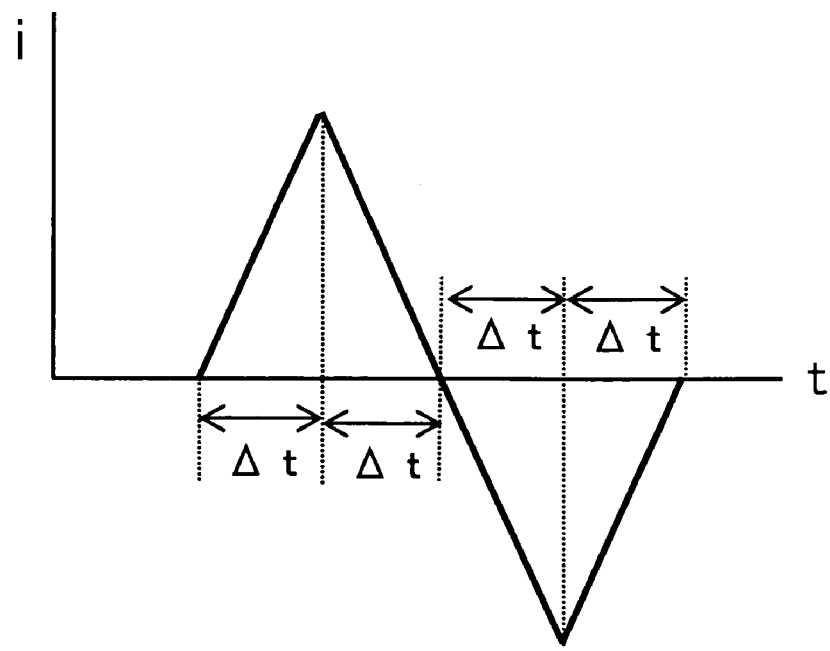
FIG. 5B is an explanatory view illustrating a method of calculating frequency from rise time or fall time of the pulse current waveform of FIG. 5A.

A pulse current having a high frequency of about 200 MHz generated by the pulse oscillation circuit 81 is supplied to the magnetosensitive wire 21 in one of the MI elements 2. Then, a magnetic field generated in a circumferential direction of the magnetosensitive wire 21 by the pulse current and an external magnetic field interact together, whereby a voltage corresponding to the external magnetic field is generated at the detection coil 22. It should be noted that the frequency mentioned here is calculated by measuring "rise" or "fall" time Δt of pulses of a pulse current waveform 10 shown in FIG. 5A and assuming that the "rise" or "fall" time Δt corresponds to one fourth of a cycle time as shown in FIG. 5B.

Next, after the pulse current has risen, the analog switch 822 is switched on and off for a short time at a predetermined timing by the sample timing adjusting circuit 821. Thus, the analog switch 822 samples a voltage generated at the detection coil 22 and corresponding to the external magnetic field. The sampled voltage is amplified by the amplifier 823 and then output. When the pulse current is cut off (i.e., the pulse current falls), a similar processing is carried out. A similar effect can be obtained by employing any known electronic circuits used in MI sensors other than the electronic circuit of this exemplary constitution.

Figure 6:
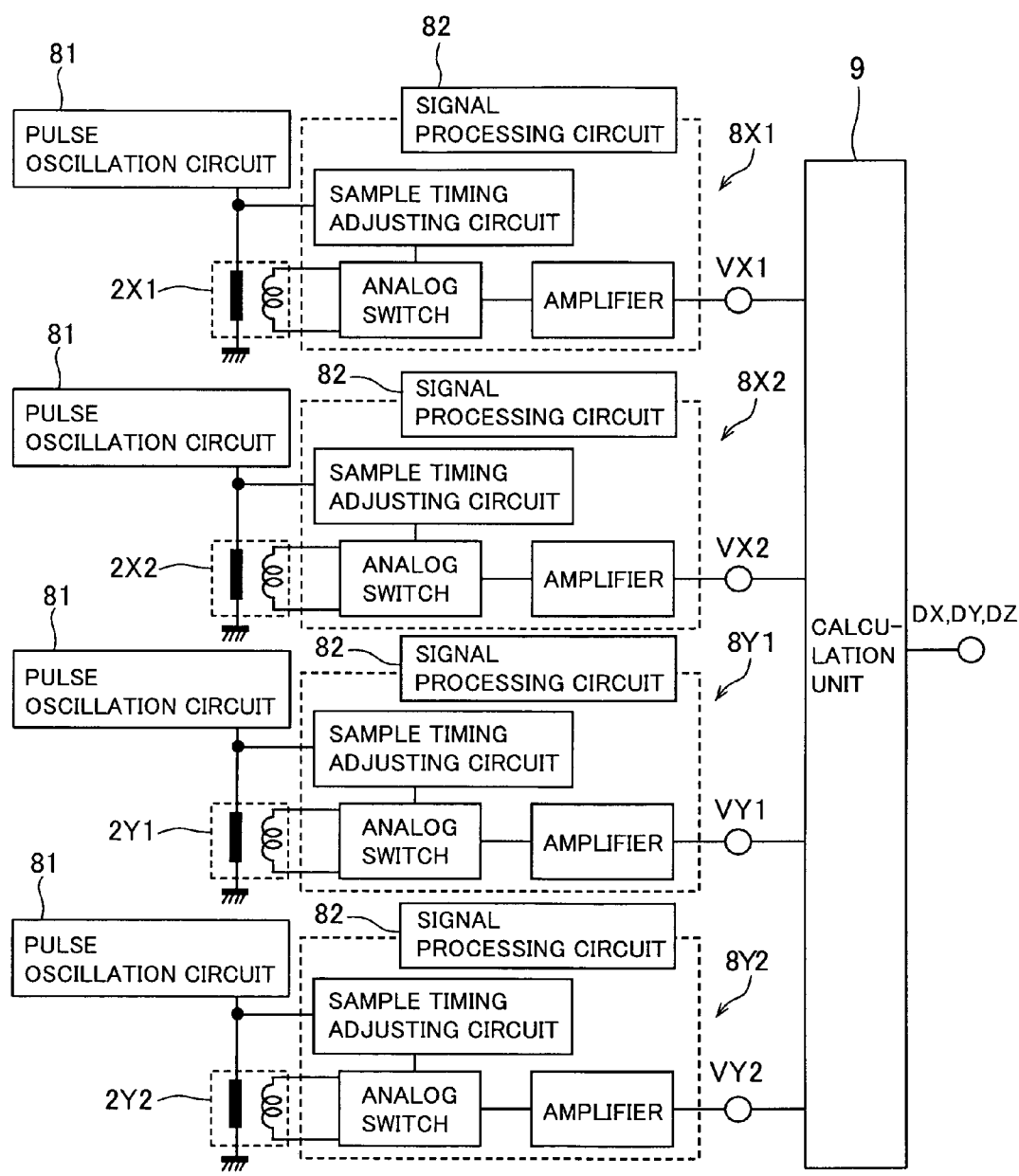
FIG. 6 is an electrical circuit diagram of a three-dimensional magnetic field detection device according to Embodiment 1.

(2) A drive circuit of the three-dimensional magnetic field detection device 1 is shown in FIG. 6. The drive circuit of the three-dimensional magnetic field detection device 1 comprises four MI sensor circuits 8 (a first X-axial MI sensor circuit 8X1, a second X-axial MI sensor circuit 8X2, a first Y-axial MI sensor circuit 8Y1, and a second Y-axial MI sensor circuit 8Y2) corresponding respectively to the four MI elements 2 (the first X-axial MI element 2X1, the second X-axial MI element 2X2, the first Y-axial MI element 2Y1, and the second Y-axial MI element 2Y2), and a calculation unit 9.

Each of the MI sensor circuits 8 comprises a pulse oscillation circuit 81 and a signal processing circuit 82. It should be noted that only one of the MI sensor circuits 8 (for example, one set of the pulse oscillation circuit 81 and the signal processing circuit 82 shown in the top of FIG. 6) can be employed as a drive circuit. In this case, while the one of the MI sensor circuits 8 is time-divided by time division switching, voltage of each one of the MI elements 2 can be detected.

<Magnetic Field Detection>

(1) An "external magnetic field" mentioned in this embodiment is an environmental magnetic field at a position at which an MI element should take a measurement. When the three-dimensional magnetic field detection device 1 is placed in an external magnetic field, the soft magnetic body 3 (see FIG. 1) changes distribution of the external magnetic field in an environment including the respective magnetosensitive wires 21. This magnetic field is called a "measurement magnetic field" because it means a magnetic field to be measured by the respective MI elements 2.

(2) When a measurement magnetic field changed by the soft magnetic body 3 acts on the first X-axial MI element 2X1, a detected voltage VX1 is output to an output terminal of the first X-axial MI sensor circuit 8X1. Similarly, when the measurement magnetic field acts on the second X-axial MI element 2X2, a detected voltage VX2 is output to an output terminal of the second X-axial MI sensor circuit 8X2. When the measurement magnetic field acts on the first Y-axial MI element 2Y1, a detected voltage VY1 is output to an output terminal of the first Y-axial MI sensor circuit 8Y1. When the measurement magnetic field acts on the second Y-axial MI element 2Y2, a detected voltage VY2 is output to an output terminal of the second Y-axial MI sensor circuit 8Y2.

Upon receiving the detected voltages VX1, VX2, VY1, VY2 from the respective MI sensors 2, the calculation unit 9 makes a calculation according to the following arithmetic expressions ([Math. 1]) and outputs output voltages DX, DY, DZ corresponding to X-axis, Y-axis and Z-axis direction components of the external magnetic field.

Thus, with the three-dimensional magnetic field detection device 1 of this embodiment, a magnetic field oriented in a Z-axis direction can be measured without providing an MI element in which a magnetosensitive wire is arranged perpendicularly to a substrate (what is called a Z-axial element). That is to say, three-dimensional magnetic field detection can be achieved while reducing size in the Z-axis direction. Furthermore, unlike conventional MI elements placed on sides of an integrated circuit, the MI elements of this embodiment are overlaid on the integrated circuit. Therefore, the three-dimensional magnetic detection device can also be downsized in parallel directions to the substrate (the X-axis direction and the Y-axis direction).

Figure 7A:
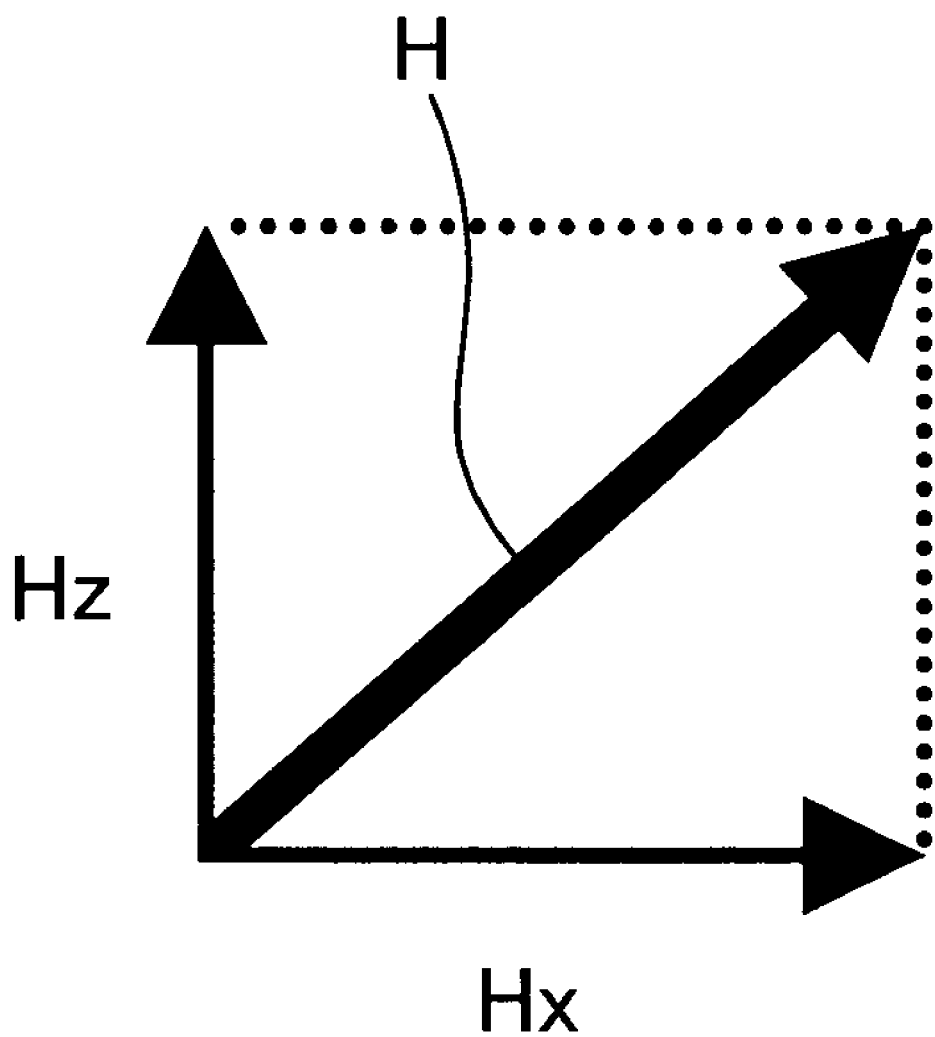
FIG. 7A is a vector diagram showing that a uniform external magnetic field H having a component in a X-Z direction is decomposed into an X-axis direction component Hx and a Z-axis direction component Hz.
Figure 7B:
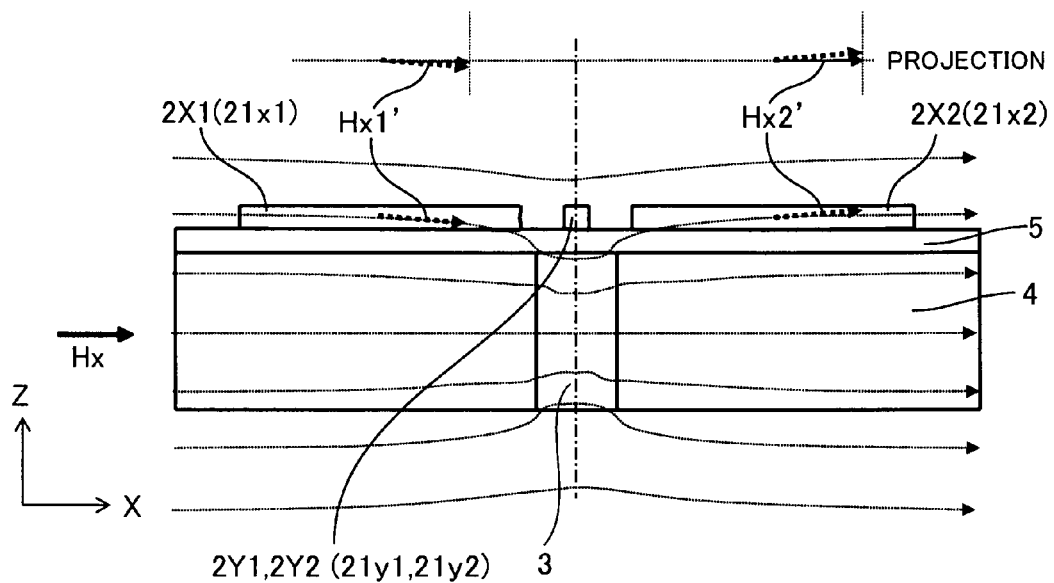
FIG. 7B is a magnetic force line diagram of a measurement magnetic field formed around the three-dimensional magnetic field detection device according to Embodiment 1 by the X-axis direction component Hx of FIG. 7A.

(3) Operations of the three-dimensional magnetic field detection device 1 when an external magnetic field H acts will be described. As a typical example, FIG. 7 show magnetic lines of force in an environment of the three-dimensional magnetic field detection device 1 including the soft magnetic body 3 in cross sectional views cut along the line A-A of FIG. 1A. First, an external magnetic field H is considered in a Z-X plane constituted by an X axis, which is one of two parallel axes to the silicon substrate 4, and a Z axis, which is perpendicular to the silicon substrate 4. When the external magnetic field H has no Y-axis direction component, the vector of the magnetic field H can be decomposed into an X-axis direction component Hx and a Z-axis direction component Hz, as shown in FIG. 7A.

<X-axis Direction Component Hx>

(1) First, let us think about the X-axis direction component Hx of the external magnetic field. Let us consider behaviors of the X-axis direction component Hx in a space between the magnetosensitive wires $21x1$, $21x2$ of the MI elements 2X1, 2X2 and the soft magnetic body 3 with reference to FIG. 7B.

In the absence of the soft magnetic body 3, since the X-axis direction component Hx of the external magnetic field is aligned in an axis direction of the magnetosensitive wires $21x1$, $21x2$ (a first axis direction), which is a magnetosensitive direction, the X-axis direction component Hx is detected as it is by these magnetosensitive wires $21x1$, $21x2$.

In this embodiment, the X-axis direction component Hx is attracted by the soft magnetic body 3. Therefore, the X-axis direction component Hx is slightly inclined in a downward Z-axis direction in the magnetosensitive wire $21x1$ and is slightly inclined in an upward Z-axis direction in the magnetosensitive wire $21x2$. Magnetic vectors inclined in these magnetosensitive bodies are respectively defined as HX1', Hx2'. Here, a magnetic field which can be detected by the MI elements 2X1, 2X2 is only projected components of the magnetic vectors Hx1', Hx2' on the X axis (the axial direction of the magnetosensitive wire $21x1$ and the magnetosensitive wire $21x2$). Therefore, only the projected components of the inclined magnetic vectors Hx1', Hx2' on the X axis are detected by way of detection coils $22x1$, $22x2$, not shown. Then, the MI sensor circuits 8X1, 8X2 (see FIG. 6) output detected voltages VX1, VX2 corresponding to these X-axis direction components Hx.

Here, the magnetic vectors Hx1', Hx2' have projected components of different polarities on the Z axis. However, these projected components are not detected because these components are originally orthogonal components, which are not in the magnetosensitive direction of the MI elements 2X1, 2X. Moreover, because the X-axis direction component Hx is also perpendicular to the magnetosensitive wires $21y1$, $21y2$ of the MI elements 2Y1, 2Y2, detected voltages VY1, VY2 are not generated.

(2) Based on these, output voltages DX, DY, DZ corresponding to the X-axis direction component Hx can be calculated by the following arithmetic expressions ([Math. 1]).

The output voltage DX can be obtained by multiplying an arithmetic mean value of the detected voltages VX1, VX2 by a coefficient, as indicated by the first expression of the arithmetic expressions. Here, the detected voltages VX1, VX2 are voltages corresponding to the X-axis direction component Hx of the external magnetic field, and theoretically have the same value and the same polarity.

The abovementioned discussion is also applicable to an external magnetic field H having no X-axis direction component in a Z-Y plane. Therefore, the output voltage DY is expressed by the second expression of the arithmetic expressions. In a magnetic field environment in which an external magnetic field H having no Y-axis direction component is given as discussed here, detected voltages VY1, VY2 are not generated as mentioned before and the output voltage DY is 0.

The output voltage DZ can be calculated by the third expression of the arithmetic expressions. Detected voltages VX1, VX2 in the third expression are voltages corresponding to the X-axis direction component Hx and theoretically have the same value and the same polarity. By subtracting one from the other in the first term of the third expression, voltages relating to the X-axis direction component of the external magnetic field cancel each other out. Moreover, detected voltages VY1, VY2 in the second term of the third expression are not generated. Therefore, the output voltage DZ is 0. Hence, when the Z-axis direction component of the external magnetic field is not present, the output voltage DZ is 0 by the third expression of the arithmetic expressions.

<Z-Axis Direction Component Hz>

(1) Next, let us think about the Z-axis direction component Hz of the external magnetic field. Let us consider behaviors of the Z-axis direction component Hz in a space between the magnetosensitive wires $21x1$, $21x2$ of the MI elements 2X1, 2X2 and the soft magnetic body 3 with reference to FIG. 7C.

In the absence of the soft magnetic body 3, since the Z-axis direction component Hz of the external magnetic field is only a component perpendicular to the magnetosensitive wires $21x1$, $21x2$, the Z-axis direction component Hz is not detected by these wires $21x1$, $21x2$ at all.

Figure 7C:
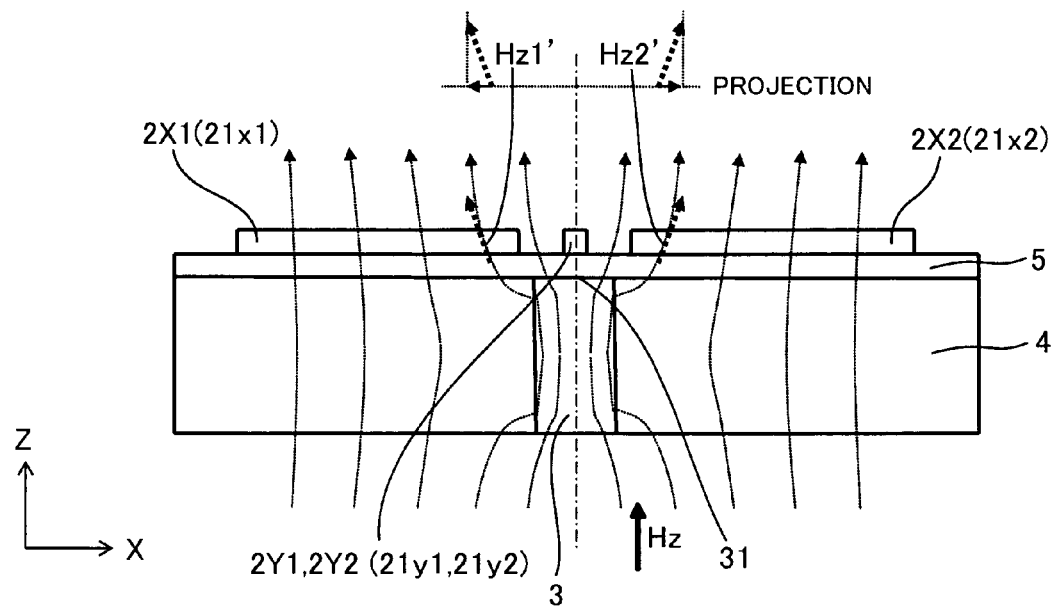
FIG. 7C is a magnetic force line diagram of a measurement magnetic field formed around the three-dimensional magnetic field detection device according to Embodiment 1 by the Z-axis direction component Hz of FIG. 7A.

In the presence of the soft magnetic body 3 as in this embodiment, a magnetic field corresponding to the Z-axis direction component Hz is attracted by the soft magnetic body 3 and then radially expands from a surface 31 of the soft magnetic body 3 toward the upside of FIG. 7C (in the positive Z-axis direction). Therefore, as shown in the cross section in FIG. 7C, the direction of the magnetic field is inclined toward the X-axis direction. Inclined magnetic vectors of this magnetic field passing through the magnetosensitive wires $21x1$, $21x2$ are defined as Hz1', Hz2'.

Here, a magnetic field which can be detected by the magnetosensitive wires $21x1$, $21x2$ is only projected components of the magnetic vectors Hz1', Hz2' on the X axis. These projected components are detected by the detection coils $22x1$, $22x2$, not shown. Then, the MI sensor circuits 8X1, 8X2 output detected voltages VX1, VX2 corresponding to the Z-axis direction component Hz. It should be noted that these projected components have the same absolute value but opposite polarities. It should also be noted that projected components of the magnetic vectors Hz1', Hz2' on the Z axis are not detected because these components are originally not in the magnetosensitive direction of the MI elements 2X1, 2X2.

Furthermore, the Z-axis direction component Hz also forms a similar magnetic field distribution in a Z-Y plane. Therefore, the MI sensor circuits 8Y1, 8Y2 output detected voltages VY1, VY2 corresponding to the Z-axis direction component Hz of the external magnetic field H, similarly to the detected voltages VX1, VX2.

(2) Based on these, output voltages DX, DY, DZ corresponding to the Z-axis direction component Hz are calculated by the following arithmetic expressions ([Math. 1]), in a similar way to those corresponding to the X-axis direction component Hx. The detected voltages VX1, VX2 are voltages corresponding to the Z-axis direction component Hz of the external magnetic field and theoretically have the same value but opposite polarities. When added together, these two voltages cancel each other out and the sum is 0. Hence, when the X-axis direction component of the external magnetic field is not present, the output voltage DX is 0 by the first expression of the following arithmetic expressions.

The detected voltages VY1, VY2 are voltages corresponding to the Z-axis direction component Hz of the external magnetic field, and theoretically have the same value but opposite polarities. When added together, the detected voltages VY1, VY2 cancel each other out and the sum is 0. Hence, when the Y-axis direction component of the external magnetic field is not present, the output voltage DY is 0 by the second expression of the following arithmetic expressions. The output voltage DZ can be calculated by respectively subtracting one from the other of the detected voltages VX1, VX2 and the detected voltages VY1, VY2 and averaging the results, and then multiplying the average values by a coefficient by the third expression of the following arithmetic expressions. Thus, a voltage corresponding to the Z-axis direction magnetic field component Hz can be output without using any Z-axial MI element or MI sensor.

<External Magnetic Field H>

By the way, the external magnetic field H is a vector sum of the X-axis direction magnetic field component Hx and the Z-axis direction magnetic field component Hz. Moreover, the discussion of the external magnetic field in the Z-X plane is also applicable to discussion of the external magnetic field in a Z-Y plane. Eventually, output voltages corresponding to the external magnetic field H can be calculated as a sum or a difference of the respective output voltages, and three-dimensional magnetic detection can be made by this embodiment.

It should be noted that the reason why output voltages DX, DY, DZ can be calculated by such simple arithmetic expressions as [Math. 1] is that the pair of X-axial MI elements 2X and the pair of Y-axial MI elements 2Y are arranged along orthogonal axes and at the same time these MI elements 2 and the soft magnetic body 3 are arranged symmetrically.

However, unless the soft magnetic body 3 is arranged in such a position that projected components of a Z-axis direction component Hz of an external magnetic field on the X axis and the Y axis are 0, output voltages corresponding to a certain axis direction magnetic field component can similarly be obtained without employing MI elements or MI sensors extending in the certain axis direction. It should be noted that when a soft magnetic body and MI elements are arranged asymmetrically or MI elements are arranged asymmetrically, respective output voltages corresponding to an external magnetic field can be calculated by using an arithmetic expression in which detected voltages are, for example, multiplied by a coefficient or added by a correction term. An example of arithmetic expressions which can be used in such cases is shown in the following [Math. 2]. In [Math. 2], $\alpha$, $\beta$, $\gamma$ are respectively coefficients.

Embodiment 2

Figure 8:
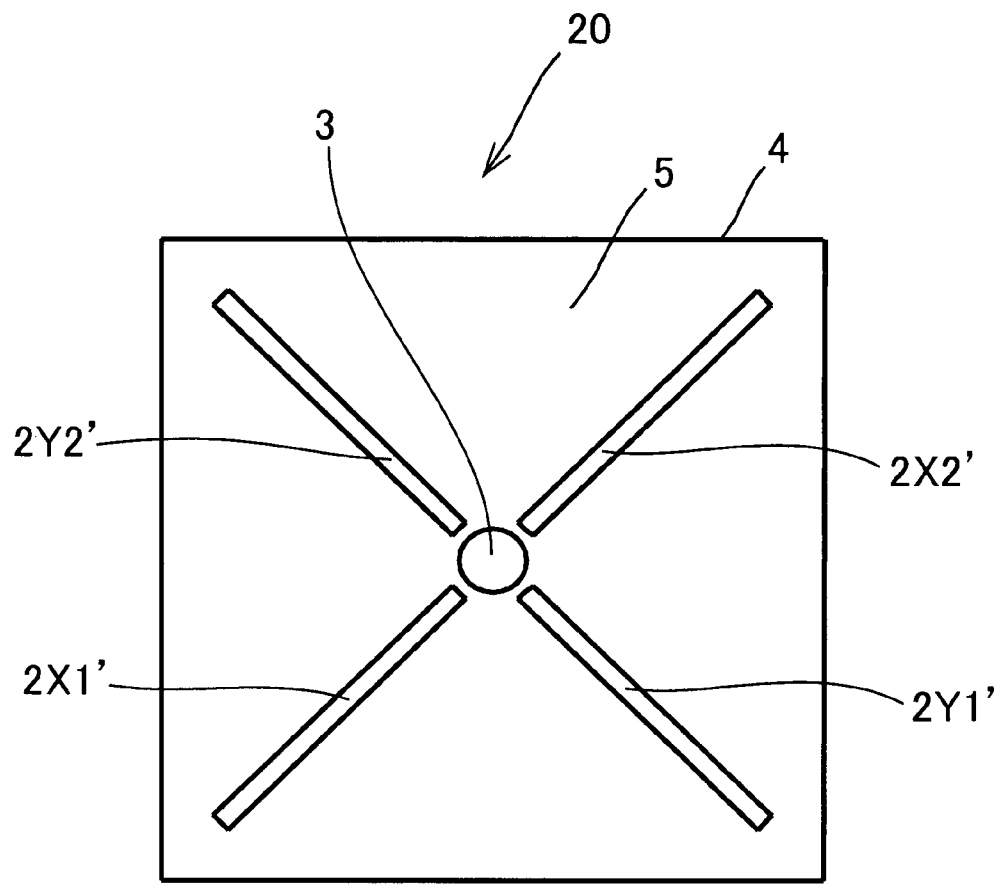
FIG. 8 is a plan view of a three-dimensional magnetic detection device according to Embodiment 2.

FIG. 8 shows a plan view of a three-dimensional magnetic detection device 20 in which arrangement of MI elements 2 is changed from that of the three-dimensional magnetic detection device 1 (FIG. 1). It should be noted that the same reference numerals will be used for convenience to refer to similar parts to those of the aforementioned three-dimensional magnetic detection device (hereinafter the same shall apply).

In the three-dimensional magnetic detection device 20, MI elements 2 are arranged on a square silicon substrate 4 so as to lie along diagonal lines at an angle of 45 degrees with respect to each side of the square. The MI elements 2 thus arranged can have a larger length with respect to a substrate of the same size. That is to say, length of the magnetosensitive bodies (amorphous wires or the like) and turns of detection coils can be increased and, as a result, output voltages can be increased.

Embodiment 3

Figure 9:
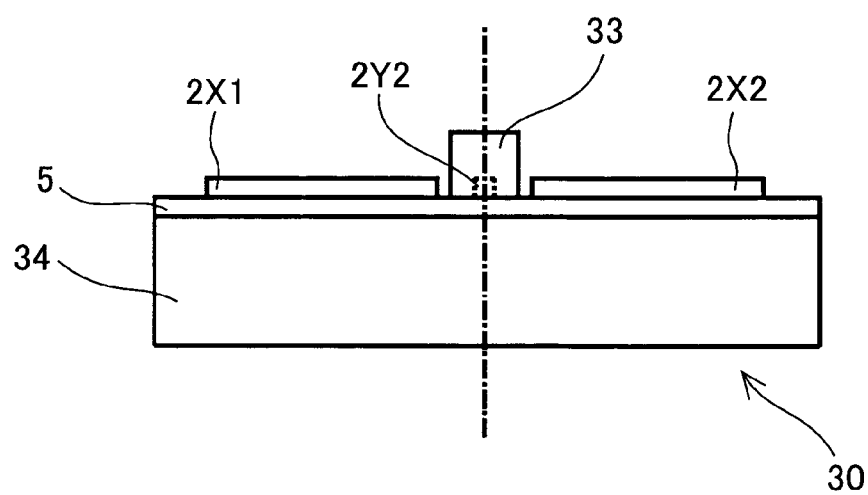
FIG. 9 is a cross sectional view of a three-dimensional magnetic detection device according to Embodiment 3.

FIG. 9 shows a cross sectional view of a three-dimensional magnetic detection device 30 in which a soft magnetic body 33 which is shorter in a Z-axis direction than the soft magnetic body 3 is arranged at a different position from that of the soft magnetic body 3. That is to say, in the three-dimensional magnetic detection device 30, the shorter soft magnetic body 33 is placed on the electrically insulating coating layer 5 without being buried in the silicon substrate 34. With this arrangement, a process for forming a hole in the silicon substrate becomes unnecessary. Moreover, the degree of integration of electronic circuits on the silicon substrate 34 can be increased by the size of the hole. In this case, planer arrangement of the shorter soft magnetic body 33 is the same as that of the soft magnetic body 3 in the three-dimensional magnetic detection device 1, i.e., a center of the silicon substrate 4.

Embodiment 4

FIG. 10 shows a cross sectional view of a three-dimensional magnetic detection device 40 in which a soft magnetic body 33 is arranged on an opposite side (a reverse side) of a silicon substrate 34. Upon adjusting the size or the like of the soft magnetic body 33, this three-dimensional magnetic detection device 40 also exhibits similar effects to those of the three-dimensional magnetic detection device 30.

Embodiment 5

FIG. 11 shows a cross sectional view of a three-dimensional magnetic detection device 50 in which a soft magnetic body 3 is not entirely buried in a silicon substrate 54 and part of the soft magnetic body 3 protrudes from the silicon substrate 54 and an electrically insulating coating layer 55. In the three-dimensional magnetic detection device 50, a head portion of the soft magnetic body 3 is aligned on the same level with upper portions of MI elements 2. With this arrangement, the three-dimensional magnetic detection device 50 does not protrude in the Z-axis direction and can be reduced in thickness in the Z-axis direction or size.

Embodiment 6

Figure 12A:
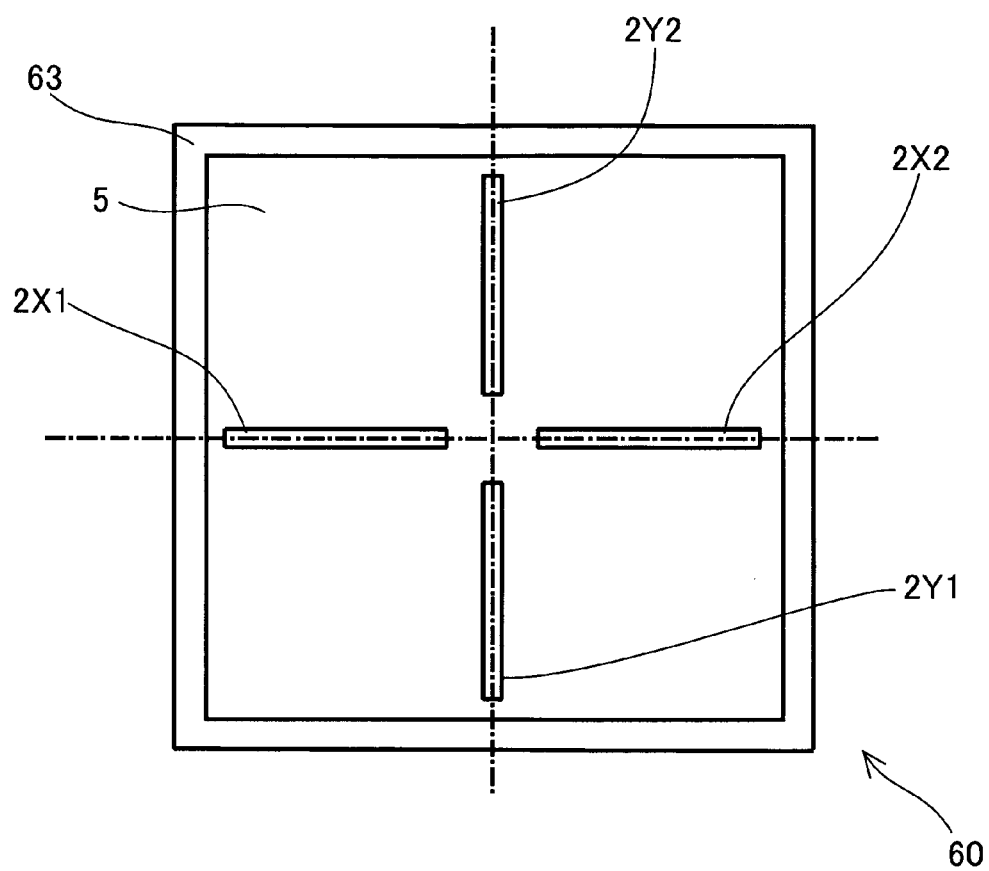
FIG. 12A is a plan view of a three-dimensional magnetic detection device according to Embodiment 6.
Figure 12B:
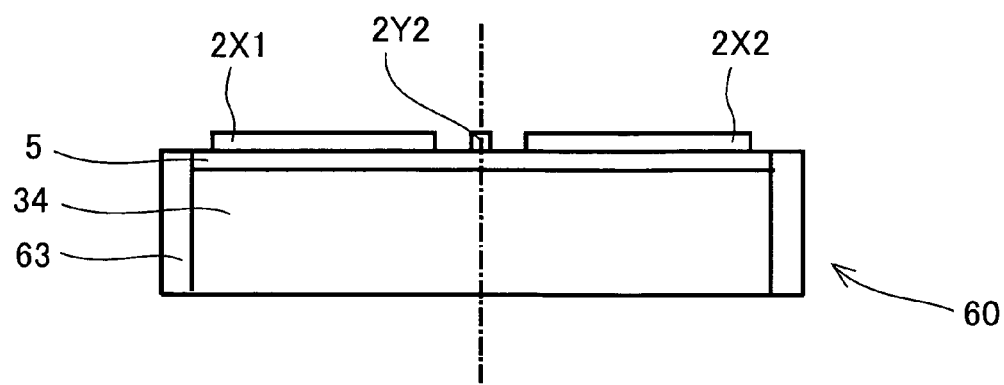
FIG. 12B is a cross sectional view of the three-dimensional magnetic detection device of FIG. 12A.

FIG. 12A and FIG. 12B respectively show a plan view and a cross sectional view of a three-dimensional magnetic detection device 60 in which the soft magnetic body 33 of the three-dimensional magnetic detection device 30 is replaced with a rectangular frame-shaped soft magnetic body 63 surrounding a rectangular silicon substrate 34. With this three-dimensional magnetic detection device 60, the volume of the soft magnetic body 63 can be increased while reducing thickness in the Z-axis direction.

Embodiment 7

Figure 13:
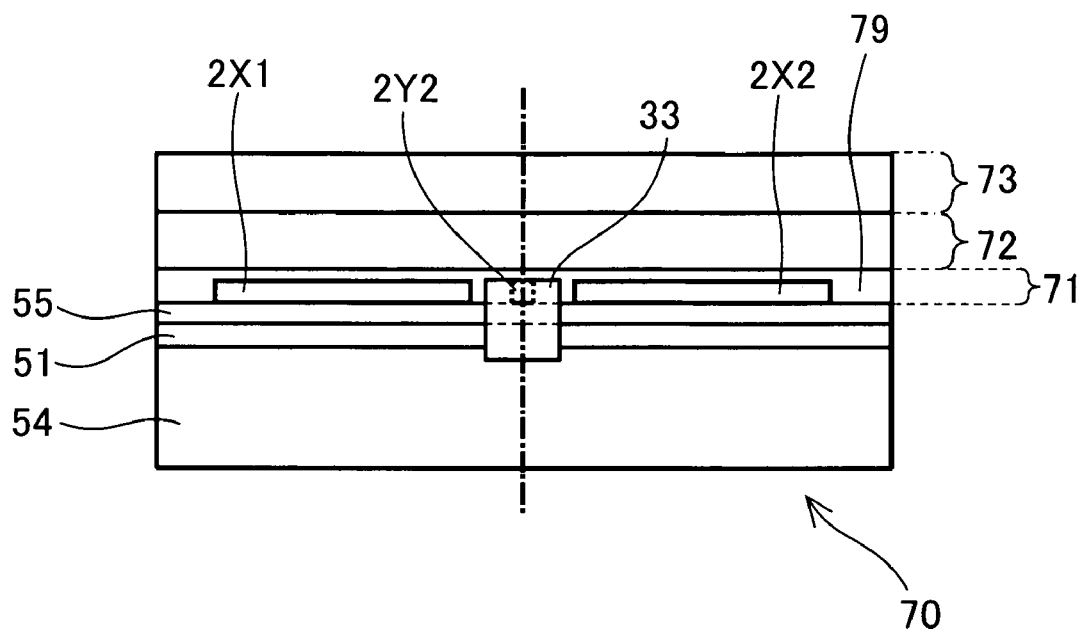
FIG. 13 is a cross sectional view of a three-dimensional magnetic detection device according to Embodiment 7.

A cross sectional view of a three-dimensional magnetic detection device 70 is shown in FIG. 13. The three-dimensional magnetic detection device 70 comprises a silicon substrate 54, an integrated circuit layer 51 (a circuit layer) formed on the silicon substrate 54 and having drive circuits of MI elements 2, an electrically insulating coating layer 55 covering the integrated circuit layer 51, a magnetosensitive layer 71 flatly covering the MI elements 2 placed on the electrically insulating coating layer 55 with an electrically insulating resin 79, a detection layer 72 overlaid on the magnetosensitive layer 71 and having a detection element other than the MI elements 2, and an integrated circuit layer 73 overlaid on the detection layer 72 and having a drive circuit of the detection element. Electrical connection between the respective layers is made through terminal holes such as via holes and through holes, not shown. FIG. 13 shows that the respective layers are laminated on only one side of the silicon substrate 54, but can be laminated on both sides of the silicon substrate 54.

Specifically speaking, the detection layer 72 comprises, for example, a detection element constituting a magnetic sensor other than the MI elements 2 (a three-dimensional magnetic sensor, a two-dimensional magnetic sensor, etc.), a direction sensor, an acceleration sensor, a temperature sensor, a gyro sensor including a magnetic gyro or the like. FIG. 13 shows only one combination of the detection layer 72 and the integrated circuit layer 73, but various kinds of detection layers can be laminated. With this layered structure, the three-dimensional magnetic sensor 70 is a composite sensor.

It should be noted that in addition to the above mentioned cases in which the respective layers are laminated in one axis direction (what is called a Z-axis direction), circuits corresponding to the respective layers can be appropriately combined and arranged in parallel in the same layer, if a detection device (a sensor) has a sufficient planar space. In this case, it is preferable that electrical connection between the respective circuits is made through wiring pattern or the like in the same layer, because the integrated sensor body can be reduced in thickness. When a detection device (a sensor) does not have a sufficient planar space, it is preferable that a plurality of layers are laminated.

Embodiment 8

Figure 14:
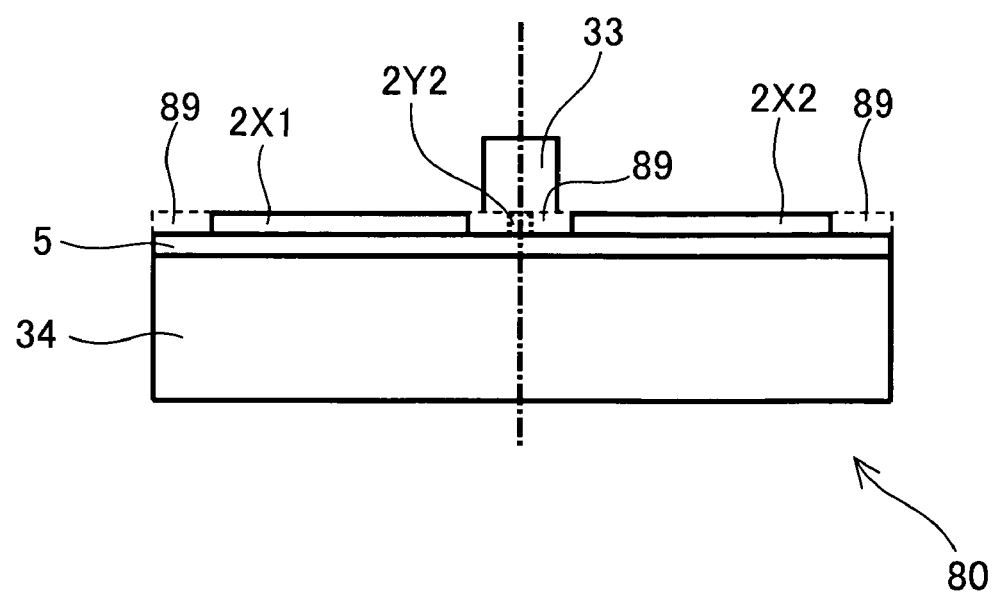
FIG. 14 is a cross sectional view of a three-dimensional magnetic detection device according to Embodiment 8.
Figure 15:
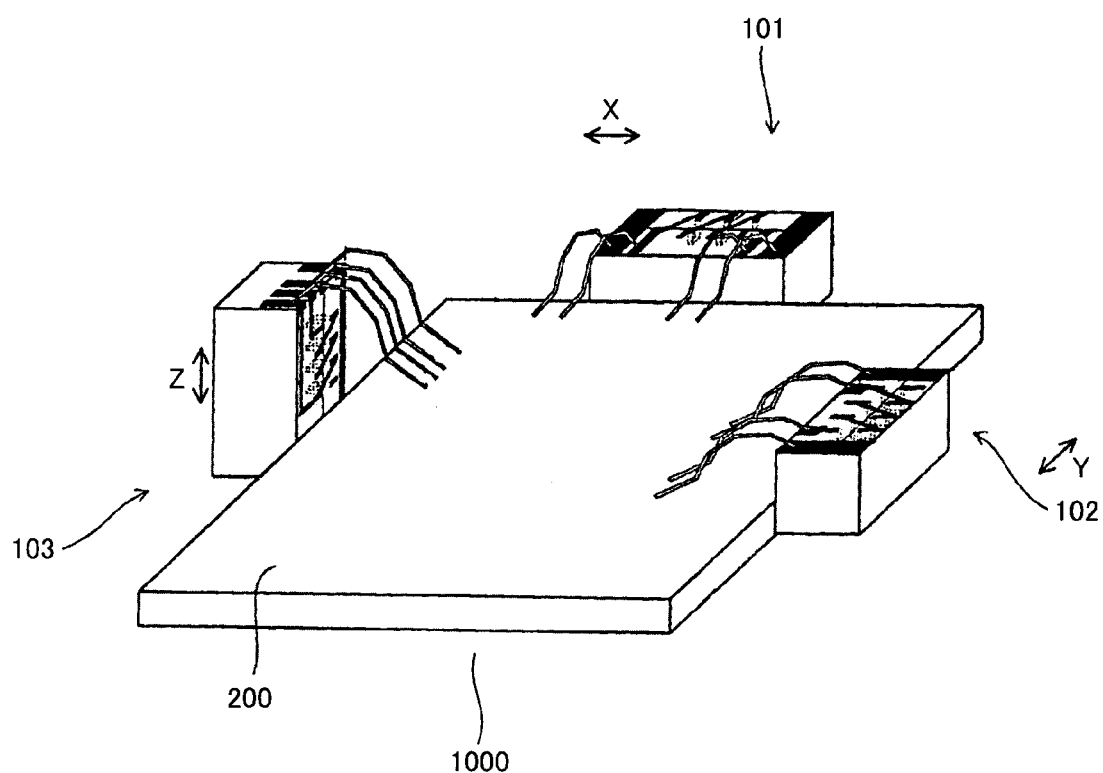
FIG. 15 is a perspective view of a conventional magnetic field detection device.

FIG. 14 shows a cross sectional view of a three-dimensional magnetic detection device 80 having a flat electrically insulating layer 89 formed of an electrically insulating resin and covering MI elements 2 placed on a silicon substrate 34, and a soft magnetic body 33 arranged on a center of the electrically insulating layer 89. An outer peripheral portion (a corner portion) of an end surface of the soft magnetic body 33 joined to the electrically insulating layer 89 are located in the vicinity of end portions of the respective MI elements 2. With this arrangement, the direction of an external magnetic field oriented in an axis extension direction (a Z-axis direction) of the soft magnetic body 33 is greatly changed into extending directions of the MI elements 2 (an X-axis direction, a Y-axis direction) and, as a result, can be efficiently detected by the MI elements 2.

INDUSTRIAL APPLICABILITY

The three-dimensional magnetic field detection device of the present invention can be used as all kinds of magnetic sensors, for example, a device requiring to three-dimensionally measure the Earth's magnetic field such as an electronic compass and a magnetic gyro, and a rotation sensor. In particular, the three-dimensional magnetic detection device of the present invention is suitable as a detection device which needs to be reduced in size in a perpendicular direction to a substrate on which the detection device is placed or thickness (what is called a Z-axis direction), such as cellular phones and other mobile terminals.

$$DX = \alpha \times \frac{VX1 + VX2}{2}$$ [Math. 1]

$$DY = \beta \times \frac{VY1 + VY2}{2}$$

$$DZ = \gamma \times \left\{ \frac{VX2 - VX1}{2} + \frac{VY2 - VY1}{2} \right\}$$

$$DX = \alpha_1 VX1 + \alpha_2 VX2$$ [Math. 2]
$$DY = \beta_3 VY1 + \beta_4 VY2$$
$$DZ = \gamma_2 VX2 - \gamma_1 VX1 + \gamma_4 VY2 - \gamma_3 VY1$$

The invention claimed is:

1. A magnetic detection device comprising:
at least one pair of first magnetosensitive bodies of a soft magnetic material that extends in a first axis direction and is sensitive to an external magnetic field oriented in the first axis direction; and
a magnetic field direction changer of the soft magnetic material that changes an external magnetic field oriented in a different axis direction from the first axis direction into a measurement magnetic field having a component in the first axis direction that can be detected by the at least one pair of first magnetosensitive bodies,
thereby the magnetic detection device can detect the external magnetic field oriented in the different axis direction by way of the first magnetosensitive bodies;
wherein the one pair of first magnetosensitive bodies is symmetrical with respect to a certain point, and
the magnetic field direction changer is symmetrical with respect to the certain point.

2. The magnetic detection device according to claim 1, comprising:
a magnetosensitive layer in which the first magnetosensitive bodies are arranged; and
a circuit layer in which a drive circuit for the first magnetosensitive bodies is arranged,
the magnetosensitive layer and the circuit layer being laminated, and the first magnetosensitive bodies and the drive circuit being electrically connected with each other through laminated layers of the magnetosensitive layer and the circuit layer.

3. The magnetic detection device according to claim 2, further comprising:
at least one detection layer in which a different detection element from the pair of first magnetosensitive bodies is arranged,
the detection layer being overlaid on the magnetosensitive layer or the circuit layer.

4. The magnetic detection device according to claim 1, wherein the one pair of first magnetosensitive bodies is arranged along the first axis.

5. A magnetic detection device comprising:
   at least one pair of first magnetosensitive bodies of a soft magnetic material that extends in a first axis direction and is sensitive to an external magnetic field oriented in the first axis direction; and
   a magnetic field direction changer of the soft magnetic material that changes an external magnetic field oriented in a different axis direction from the first axis direction into a measurement magnetic field having a component in the first axis direction that can be detected by the at least one pair of first magnetosensitive bodies,
   thereby the magnetic detection device can detect the external magnetic field oriented in the different axis direction by way of the first magnetosensitive bodies;
   at least one pair of second magnetosensitive bodies of a soft magnetic material that extends in a second axis direction and is sensitive to an external magnetic field oriented in the second axis direction,
   the magnetic field direction changer changes an external magnetic field oriented in a different axis direction from the first axis direction and the second axis direction into a measurement magnetic field having a first component in the first axis direction, a second component in the second axis direction or the first and second components that can be detected by the at least one pair of first magnetosensitive bodies, the at least one pair of second magnetosensitive bodies or the at least one pair of first magnetosensitive and the at least one pair of second magnetosensitive bodies.

6. The magnetic detection device according to claim 5, wherein the one pair of first magnetosensitive bodies is arranged along the first axis.

7. The magnetic detection device according to claim 5, comprising:
   a magnetosensitive layer in which the first magnetosensitive bodies are arranged; and
   a circuit layer in which a drive circuit for the first magnetosensitive bodies is arranged,
   the magnetosensitive layer and the circuit layer being laminated, and the first magnetosensitive bodies and the drive circuit being electrically connected with each other through laminated layers of the magnetosensitive layer and the circuit layer.

8. The magnetic detection device according to claim 7, further comprising:
   at least one detection layer in which a different detection element from the pair of first magnetosensitive bodies is arranged,
   the detection layer being overlaid on the magnetosensitive layer or the circuit layer.

9. The magnetic detection device according to claim 5, wherein the one pair of first magnetosensitive bodies is symmetrical with respect to a certain point, and
   the magnetic field direction changer is symmetrical with respect to the certain point.

* * * * *